United States Patent
Cheng

(10) Patent No.: US 9,280,291 B2
(45) Date of Patent: Mar. 8, 2016

(54) METHOD FOR DATA ACCESSING AND MEMORY WRITING FOR LOGIC ANALYZER

(71) Applicant: ZEROPLUS TECHNOLOGY CO., LTD., New Taipei (TW)

(72) Inventor: Chiu-Hao Cheng, New Taipei (TW)

(73) Assignee: ZEROPLUS TECHNOLOGY CO., LTD., New Taipei (TW)

( * ) Notice: Subject to any disclaimer, the term of this patent is extended or adjusted under 35 U.S.C. 154(b) by 235 days.

(21) Appl. No.: 13/761,561

(22) Filed: Feb. 7, 2013

(65) Prior Publication Data

US 2013/0212346 A1  Aug. 15, 2013

(30) Foreign Application Priority Data

Feb. 15, 2012  (TW) .............................. 101104958 A

(51) Int. Cl.
| | |
|---|---|
| *G06F 12/00* | (2006.01) |
| *G06F 3/06* | (2006.01) |
| *G01R 31/3177* | (2006.01) |
| *G11C 29/56* | (2006.01) |
| *G01R 31/3183* | (2006.01) |

(52) U.S. Cl.
CPC .......... *G06F 3/0611* (2013.01); *G01R 31/3177* (2013.01); *G11C 29/56* (2013.01); *G01R 31/318314* (2013.01); *G11C 2029/5602* (2013.01)

(58) Field of Classification Search
CPC . G06F 11/3636; G06F 11/25; G06F 11/3656; G01F 31/3177; G01R 31/31705
USPC .......................................................... 711/161
See application file for complete search history.

(56) References Cited

U.S. PATENT DOCUMENTS

| | | | |
|---|---|---|---|
| 4,550,387 A * | 10/1985 | Takita .............................. 377/55 |
| 4,558,422 A * | 12/1985 | DenBeste et al. ................ 702/57 |
| 5,144,225 A * | 9/1992 | Talbot et al. ................. 324/73.1 |
| 5,608,866 A * | 3/1997 | Horikawa ........................ 714/39 |
| 5,933,594 A * | 8/1999 | La Joie et al. ................... 714/26 |
| 2002/0159086 A1* | 10/2002 | Shinomiya et al. ........... 358/1.13 |
| 2006/0143518 A1* | 6/2006 | Cheng et al. .................... 714/25 |
| 2007/0047458 A1* | 3/2007 | Adkisson ...................... 370/252 |
| 2007/0220352 A1* | 9/2007 | Hernandez et al. ............. 714/39 |
| 2008/0240370 A1* | 10/2008 | Wang et al. ..................... 379/30 |
| 2008/0301500 A1* | 12/2008 | Genden et al. .................. 714/30 |
| 2010/0027031 A1* | 2/2010 | Stimpson et al. ............. 356/614 |
| 2010/0223502 A1* | 9/2010 | Brunot et al. ................... 714/29 |

* cited by examiner

*Primary Examiner* — Charles Rones
*Assistant Examiner* — Nanci Wong
(74) *Attorney, Agent, or Firm* — Ming Chow; Sinorica, LLC

(57) ABSTRACT

A method of fetching digital data and writing the digital data into a memory of a logic analyzer, which comprises the steps: designate at least a first region and a second region in a memory; set a first triggering condition and a second triggering condition; fetch digital data continuously and write it into the memory while analyzing; and then write first test data which have an identification to satisfy the first triggering condition into the first region, and write second test data which have an identification to satisfy the second triggering condition into the second region. And once the first test data or the second test data are found, stop writing the digital data into the corresponding regions.

17 Claims, 3 Drawing Sheets

DAT1

DAT2

METHOD FOR DATA ACCESSING AND MEMORY WRITING FOR LOGIC ANALYZER

BACKGROUND OF THE INVENTION

1. Technical Field

The present invention relates to a logic analyzer, and more particularly to a method of fetching data and writing the data into a memory of a logic analyzer.

2. Description of Related Art

Along with the development of digital technology, electronic devices with digital data transmission functions, such as electronic chips, image processing chips for liquid crystal display (LED), complementary metal-oxide semiconductor (CMOS), and charge coupled device (CCD), are commonly used nowadays.

The logic analyzer is an important element at developing the aforementioned electronic devices, which is useful to analyze the digital data outputted by an electronic device, and therefore to find out if the analyzed electronic device has normal functions.

The conventional logic analyzer fetches the data from an electronic device and writes it into a memory thereof until the memory is full. However, only a little piece among the fetched digital data is useful, so the conventional way of fetching data is ineffective for the usage of the memory, and it may causes unnecessary work for the developers. In conclusion, the conventional method of fetching and writing data needs to be improved.

BRIEF SUMMARY OF THE INVENTION

In view of the above, the primary objective of the present invention is to provide a method of fetching data and writing the data into a memory for a logic analyzer, which enhances the efficiency of the memory usage. Furthermore, the method only fetches necessary data, therefore enhances the efficiency of analysis.

The present invention provides a method of fetching digital data and writing the digital data into a memory of a logic analyzer, which comprises the stops of: A. designating a first region and a second region in a memory; B. setting a first triggering condition and a second triggering condition; C. fetching digital data and writing the digital data into the memory, wherein the digital data have first test data and second test data; the first test data have an identification, which satisfies the first triggering condition, and the second test data have an identification too, which satisfies the second triggering condition; D. finding the first test data and the second test data in the digital data, and then writing the first test data into the first region, and writing the second test data into the second region, wherein the digital data are restricted from being written into the first region once the first test data are found and written into the first region, and the digital data are restricted from being written into the second region once the second test data are found and written into the second region.

In an embodiment, a length of the first test data is equal to or shorter than a length of the first region, and a length of the second test data is equal to or shorter than a length of the second region.

In an embodiment, the length of the first region is equal to the length of the second region.

In an embodiment, the length of the first region is not equal to the length of the second region.

In an embodiment, the first triggering condition is the same as the second triggering condition.

In an embodiment, the first triggering condition is different from the second triggering condition.

In an embodiment, the first test data are written into the first region under a first sampling frequency, and the second test data are written into the second region under a second sampling frequency. The first sampling frequency is equal to the second sampling frequency.

In an embodiment, the first test data are written into the first region under a first sampling frequency, and the second test data are written into the second region under a second sampling frequency. The first sampling frequency is not equal to the second sampling frequency.

In an embodiment, the first sampling frequency is higher than the second sampling frequency.

In an embodiment, the method further comprises the steps of recording a first time point which indicates when the first test data are written into the first region, and recording a second time point which indicates when the second test data are written into the second region.

In an embodiment, the first time point and the second time point are obtained by calculating a period of time since the time when the digital data start to be fetched, or since the time when the previous first test data are written into the first region or the previous second test data are written into the second region, to the time when the first test data or the second test data are written into the first region or the second region.

In an embodiment, the first time point and the second time point are obtained via a timer.

In an embodiment, the first time point and the second time point are obtained by calculating a sum of products of an occurring cycle of a number of specific data and occurring counts of those specific data.

In an embodiment, the digital data are overwritten into the first region in the step C until the first test data are found and written into the first region.

In an embodiment, the digital data are overwritten into the second region in the step C until the second test data are found and written into the second region.

In an embodiment, the method further comprises the step of setting a length of the first test data.

In an embodiment, the method further comprises the step of setting a length of the second test data.

In an embodiment, the digital data are written into the first region in the beginning of the step C, and the digital data are written into the second region only after the first test data are found and written in the first region.

In an embodiment, the digital data are written into both the first region and the second region at the same time in the step C.

With the provided method, the efficiency of the memory usage and analysis could be enhanced.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
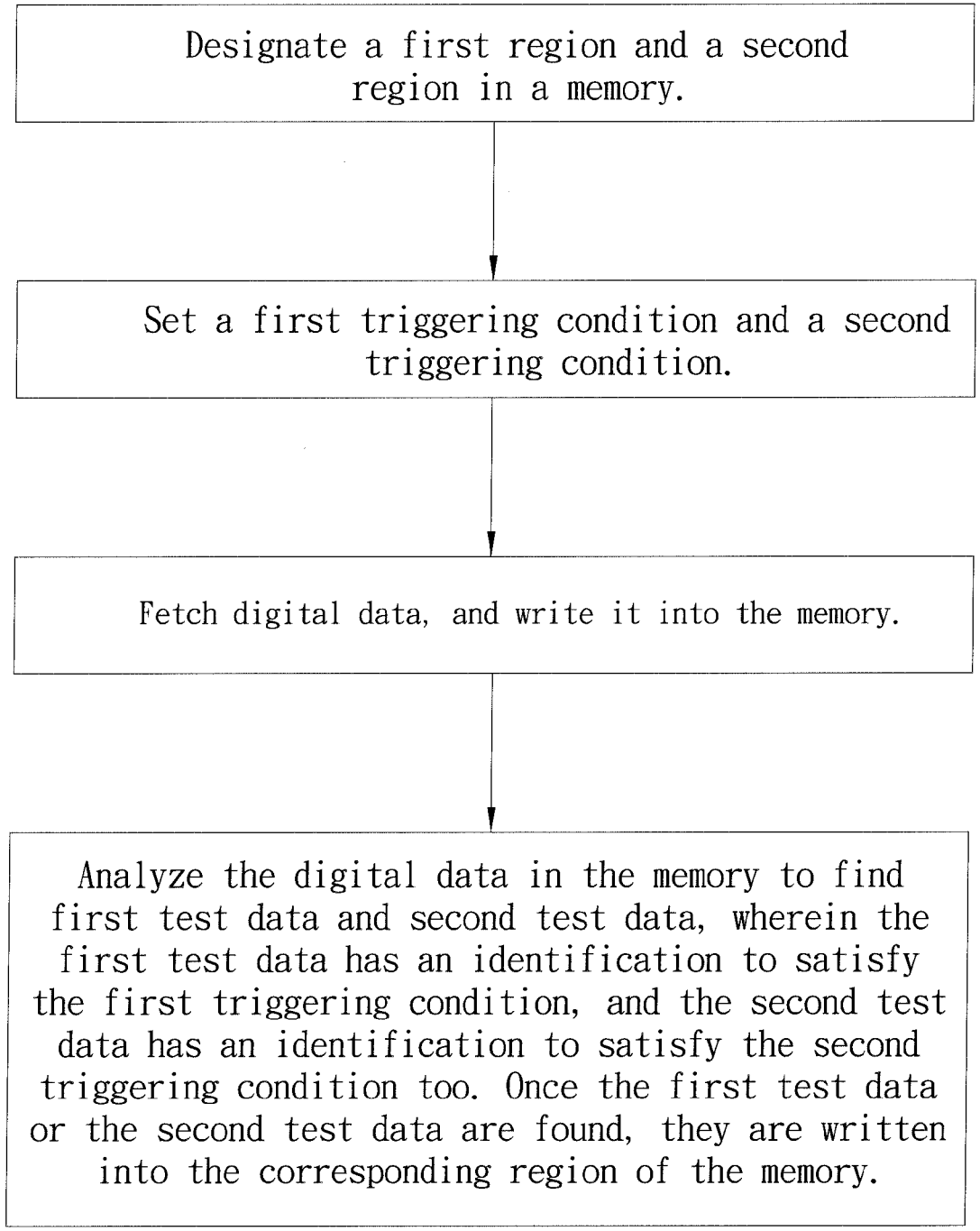
FIG. 1 is a flowchart of a preferred embodiment of the present invention.
Figure 2:
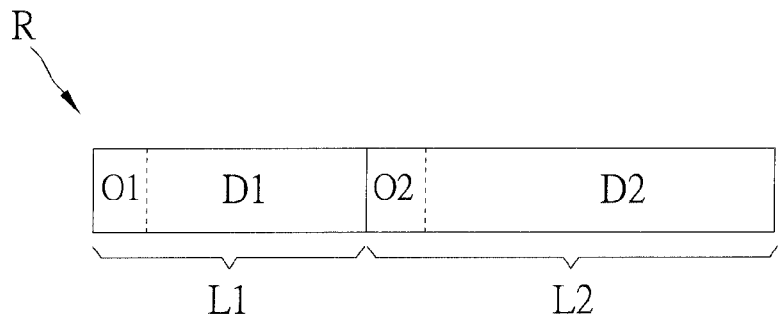
FIG. 2 is a sketch diagram of the step A and the step B of the preferred embodiment of the present invention.

FIG. 1 shows a flowchart of a method of fetching data and writing the data into a memory of a logic analyzer, and the method includes the following steps:

A. Designate at least a first region D1 and a second region D2 in a memory R. The first region D1 has a first length L1, and the second region D2 has a second length L2. In an embodiment, the first length L1 and the second length L2 are not equal, but not limited. For some circumstances, the first length L1 is equal to the second length L2.

B. Set a first triggering condition O1 and a second triggering condition O2. In an embodiment, the first triggering condition O1 corresponds to the first region D1, and the second triggering condition O2 corresponds to the second region D2, but not limited. In an embodiment, in order to achieve the design of multiple triggering, the first triggering condition O1 is different from the second triggering condition O2, but not limited. For certain purposes, the first triggering condition O1 could be the same with the second triggering condition O2 to achieve single triggering design.

Figure 3:
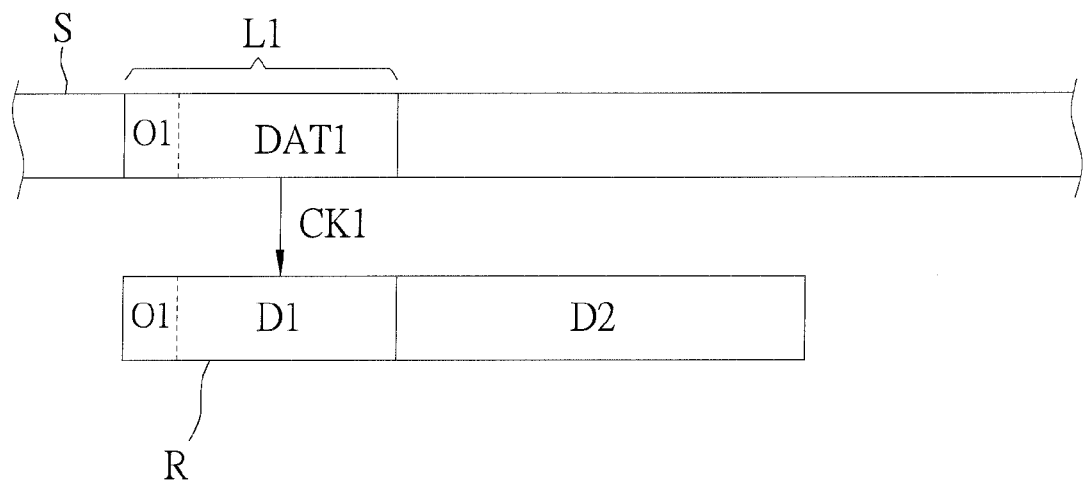
FIG. 3 is a sketch diagram of the step C of the preferred embodiment of the present invention.

C. As shown in FIG. 3, fetch digital data S from an electronic device, and write the digital data S into the memory R. In practice, the digital data S may come from two or more electronic devices.

D. Analyze the digital data S in the memory R to find first test data DAT1 and second test data DAT2. In an embodiment, the first test data DAT1 have an identification, which satisfies the first triggering condition O1, while the second test data DAT2 have an identification, which satisfies the second triggering condition O2. The logic analyzer compares the identifications with the first triggering condition O1 and the second triggering condition O2 to find the first test data DAT1 and the second test data DAT2. Once the first test data DAT1 are found, the first test data DAT1 are written into the first region D1 (FIG. 3), and the digital data S stop to be written into the first region D1. Similarly, once the second test data DAT2 are found, the second test data DAT2 are written into the second region D2 (FIG. 4), and the digital data S stop to be written into the second region D2. In an embodiment, the digital data S could only be written into the first region D1, until the first test data DAT1 are found and written into the first region D1. If the first region D1 is full, but the first test data DAT1 are yet not found, the upcoming digital data S will overwrite the digital data S in the first region D1 from the beginning. In an embodiment, the digital data S will be written only into the second region D2 after the first test data DAT1 being found; and in another embodiment, the digital data S could be written into both the first region D1 and the second region D2 at the same time, in order to make the first region D1 and the second region D2 work independently.

In an embodiment, lengths of the first and the second test data DAT1, DAT2 are subject to change, and the lengths of the test data DAT1 and DAT2 are proportional to the lengths L1, L2 of the first and the second regions D1, D2. For example, the first and the second test data DAT1 and DAT2 are 60% of the lengths L1, L2 of the first and the second regions D1, D2. In other words, if the length L1 of the first region D1 is 100 kb, the length of the test data DAT1 will be 60 kb.

Figure 5:
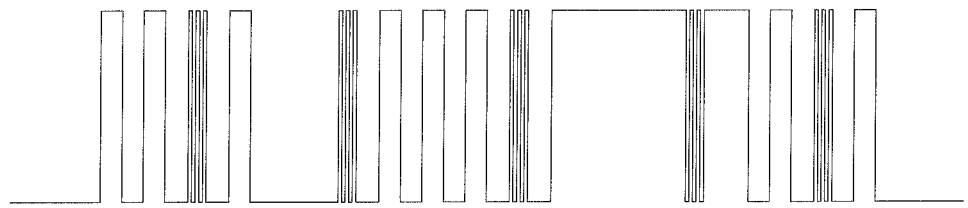
FIG. 5 shows the weave forms obtained under different sampling frequencies.
Figure 5:
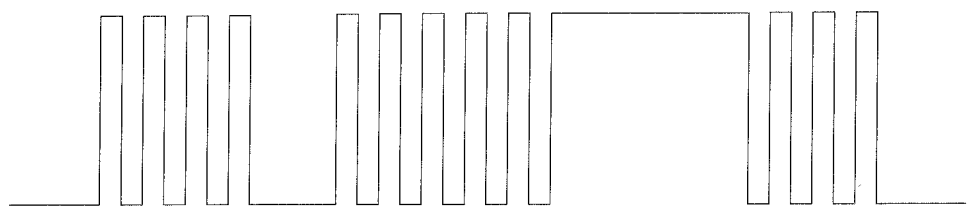

In an embodiment, the digital data S are fetched under a first sampling frequency CK1, and then written into the first region D1 with such frequency. At the same time, the digital data S are fetched under a second sampling frequency CK2, and then written into the second region D2 with such frequency too. The first sampling frequency CK1 could be different to the second sampling frequency CK2. As shown in FIG. 5, suppose the first triggering condition O1 is equal to the second triggering condition O2, and the first sampling frequency CK1 is higher than the second sampling frequency CK2, the first and the second test data DAT1 and DAT2, at the same time, will be written into the first and the second regions D1, D2 respectively with different frequencies, and therefore the same test data (DAT1 and DAT2) could have different appearances for better analyzing.

Figure 4:
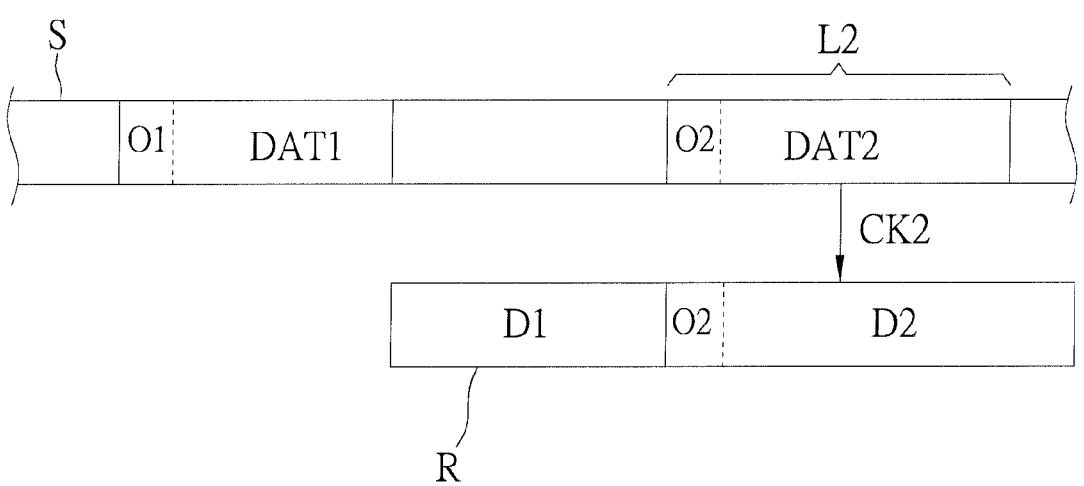
FIG. 4 is a sketch diagram of the step D of the preferred embodiment of the present invention.

In FIG. 3 and FIG. 4, the length of the first test data DAT1 is equal to the length L1 of the first region D1, and the length of the second test data DAT2 is equal to the length L2 of the second region D2. For some circumstances, the test data DAT1 or DAT2 may be shorter than the preset length. For example, if the digital data S have two neighboring identifications, one of which satisfies the first triggering condition O1 and the other one satisfies the second triggering condition O2, the logic analyzer will identify data between the identifications as the test data DAT1 (if the first triggering condition O1 come before the second triggering condition O2) or DAT2 (otherwise), and sometime, the length of such test data could be shorter than the preset length.

In an embodiment, the related time information while writing the test data DAT1 or DAT2 into the region D1 or D2 is saved along with the first test data DAT1 and the second test data DAT2 to provide more information for analyzing. The related time information includes a first time point indicates the time point when the first test data DAT1 are written into the first region D1, and a second time point indicates the time point when the second test data DAT2 are written into the second region D2. In an embodiment, the first and the second time points are obtained by calculating a period of time since the digital data S start to be fetched to the test data being written for the first time, or a period of time between the first test data DAT1 being written and the second test data DAT2 being written. The aforementioned periods of time could be obtained by calculating a sum of product of an occurring cycle of a number of specific data and occurring counts of the specific data in the period of time. For example, if first data occur for N times, and second data occur for M times between the time when the first and the second test data DAT1 and DAT2 are found, and the occurring cycle of the first data is T1, while the occurring cycle of the second data is T2. Therefore, the period of time could be calculated as N×T1+M×T2. In another embodiment, the related time information could be obtained simply via the clock of the operating system or a timer.

In conclusion, the present invention may fetch and write the data in an efficient way. Furthermore, the lengths of the regions, the triggering conditions, and the sampling frequency could be set freely to enhance the efficiency of testing and analyzing an electronic device. It is noted that there are only two regions in the aforementioned embodiments, but in practice, the memory R could be designated into more regions.

It must be pointed out that the embodiments described above are only some preferred embodiments of the present invention. All equivalent methods which employ the concepts disclosed in this specification and the appended claims should fall within the scope of the present invention.

What is claimed is:

1. A method of fetching digital data and writing the digital data into one single memory of one single logic analyzer, comprising the steps of:
   A. designating a first region and a second region in the one single memory of the one single analyzer;

B. setting a first triggering condition and a second triggering condition;

C. fetching digital data and writing the digital data into the memory, wherein the digital data have first test data and second test data; the first test data have an identification, which satisfies the first triggering condition, and the second test data have an identification too, which satisfies the second triggering condition;

D. finding the first test data and the second test data in the digital data, and then writing the first test data into the first region, and writing the second test data into the second region, wherein the digital data are restricted from being written into the first region once the first test data are found and written into the first region, and the digital data are restricted from being written into the second region once the second test data are found and written into the second region; and E. recording a first time point which indicates when the first test data are written into the first region, and recording a second time point which indicates when the second test data are written into the second region, wherein the first time point and the second time point are obtained by calculating a sum of products of an occurring cycle of a number of specific data and occurring counts of those specific data.

2. The method of claim 1, wherein a length of the first test data is equal to or shorter than a length of the first region, and a length of the second test data is equal to or shorter than a length of the second region.

3. The method of claim 2, wherein the length of the first region is equal to the length of the second region.

4. The method of claim 2, wherein the length of the first region is not equal to the length of the second region.

5. The method of claim 1, wherein the first triggering condition is the same as the second triggering condition.

6. The method of claim 4, wherein the first triggering condition is different from the second triggering condition.

7. The method of claim 1, wherein the first test data are written into the first region under a first sampling frequency; the second test data are written into the second region under a second sampling frequency; the first sampling frequency is equal to the second sampling frequency.

8. The method of claim 1, wherein the first test data are written into the first region under a first sampling frequency; the second test data are written into the second region under a second sampling frequency; the first sampling frequency is not equal to the second sampling frequency.

9. The method of claim 8, wherein the first sampling frequency is higher than the second sampling frequency.

10. The method of claim 1, wherein the first time point and the second time point are obtained by calculating a period of time since the time when the digital data start to be fetched, or since the time when the previous first test data are written into the first region or the previous second test data are written into the second region, to the time when the first test data or the second test data are written into the first region or the second region.

11. The method of claim 1, wherein the first time point and the second time point are obtained via a timer.

12. The method of claim 1, wherein the digital data are overwritten into the first region in the step C until the first test data are found and written into the first region.

13. The method of claim 1, wherein the digital data are overwritten into the second region in the step C until the second test data are found and written into the second region.

14. The method of claim 1, further comprising the step of setting a length of the first test data.

15. The method of claim 1, further comprising the step of setting a length of the second test data.

16. The method of claim 1, wherein the digital data are written into the first region in the beginning of the step C, and the digital data are written into the second region only after the first test data are found and written in the first region.

17. The method of claim 1, wherein the digital data are written into both the first region and the second region at the same time in the step C.

* * * * *